United States Patent [19]

Akiba et al.

[11] 4,340,966
[45] Jul. 20, 1982

[54] SEMICONDUCTOR LASER WITH BUFFER LAYER

[75] Inventors: Shigeyuki Akiba, Tokyo; Yasuharu Suematsu, Kawasaki; Shigehisa Arai, Tokyo; Masanobu Kodaira, Yokohama; Yoshio Itaya, Tokyo; Kenichi Iga, Machida; Chuichi Ota, Fuchu; Takaya Yamamoto, Niza; Kazuo Sakai, Tokyo, all of Japan

[73] Assignee: Kokusai Denshin Denwa Kabushiki Kaisha, Japan

[21] Appl. No.: 122,171

[22] Filed: Feb. 19, 1980

[30] Foreign Application Priority Data

Aug. 15, 1979 [JP] Japan .................. 54-103125

[51] Int. Cl.$^3$ ............................... H01S 3/19
[52] U.S. Cl. ..................... 372/45; 357/17; 372/46
[58] Field of Search ............... 331/94.5 H; 357/16, 357/17, 18; 372/45, 46

[56] References Cited

U.S. PATENT DOCUMENTS 4,258,375 3/1981 Hsieh et al. .................. 357/16

OTHER PUBLICATIONS

Oe et al, "GaInAsP-InP Double Heterostructure Lasers Prepared by a New LPE Apparatus", Japan J. Appl. Phys. vol. 15 (1976) No. 10, pp. 2003–2004.
Nagai et al, "InP-Ga$_x$In$_{1-x}$As$_y$P$_{1-y}$ Double Heterostructure for 1.5 μm Wavelength" App. Phys. Lett. 32(4), Feb. 15, 1978, pp. 234–236.
Arai et al, "Room Temperature CW Operation of GaInAsP/InP DH Laser Emitting at 1.51 μm", Jpn. J. Appl. Phys., vol. 18, Dec. 1979, No. 12, pp. 2333–2334.

Primary Examiner—James W. Davie
Attorney, Agent, or Firm—Robert E. Burns; Emmanuel J. Lobato; Bruce L. Adams

[57] ABSTRACT

A semiconductor laser formed on an InP substrate to have a hetero structure comprising a plurality of In$_{1-x}$Ga$_x$As$_y$P$_{1-y}$ ($0.42y \leq x \leq 0.5y, 0 \leq y \leq 1$) layers which are lattice-matched with InP, in which a light emitting layer included in the layers and having a forbidden band width larger than 0.6 eV but smaller than 0.9 eV at room temperature is sandwiched between two InP layers on the InP substrate, and in which there is provided between the light emitting layer and the InP layer grown thereon at least one buffer layer having a forbidden band width larger than the forbidden band width of the light emitting layer but smaller than the forbidden band width of InP. The forbidden band width of the buffer layer at room temperature may be larger than 0.8 eV but smaller than 1.0 eV.

2 Claims, 4 Drawing Figures

SEMICONDUCTOR LASER WITH BUFFER LAYER

BACKGROUND OF THE INVENTION

This invention relates to a hetero-structure semiconductor laser which is formed on an InP substrate.

With the progress of studies for the reduction of a loss in optical fibers made of silica, the loss has now been made small in the vicinity of 1.55 μm to such an extent as to be considered ultimate at the present stage; and this wavelength range is considered optimum for a long-distance optical fiber transmission. Light sources for use in the abovesaid wavelength range have been developed by laying stress on an InGaAsP laser formed on an InP substrate, but there has not yet been obtained a light source which performs the CW operation (a continuous operation) at room temperature. The reason for this is that it is difficult to obtain a good quality crystal having a multi-layer, hetero structure, although such crystal has been available for use at shorter wavelengths.

SUMMARY OF THE INVENTION

An object of this invention is to provide a semiconductor laser capable of performing the CW operation at room temperature.

In accordance with this invention, there is provided a semiconductor laser formed on an InP substrate to have a hetero structure comprising a plurality of $In_{1-x}Ga_xAs_yP_{1-y}$ ($0.42y \leq x \leq 0.5y$, $0 \leq y \leq 1$) layers which is lattice-matched with InP. The semiconductor laser have a light emitting layer included in the layers and having a forbidden band width larger than 0.6 eV but smaller than 0.9 eV at room temperature is sandwiched between two InP layers on the InP substrate, and there is provided between the light emitting layer and the InP layer grown thereon at least one buffer layer having a forbidden band width larger than the forbidden band width of the light emitting layer but smaller than the forbidden band width of InP.

The forbidden band width of the buffer layer at room temperature may be larger than 0.8 eV but smaller than 1.0 eV.

DETAILED DESCRIPTION

Figure 1:
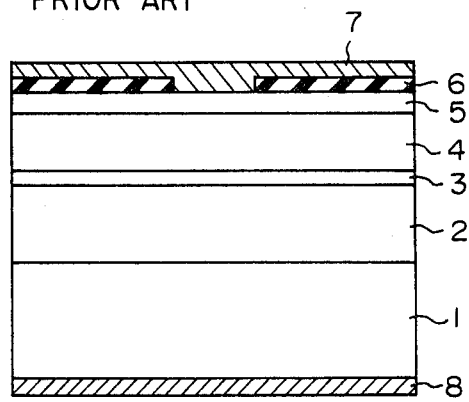
FIG. 1 is a section of a conventional InGaAsP/InP semiconductor laser for a 1.1 to 1.3 μm band.

With reference to FIG. 1, an example of a conventional InGaAsP/InP laser, which oscillates at a wavelength range of 1.1 to 1.3 μm, will first be described. In the fabrication of this laser, an n-type InP lower clad layer 2, an n- or p-type InGaAsP light emitting layer 3, a p-type InP upper clad layer 4 and a p+-type InGaAsP layer 5 for ohmic contact use are successively grown, for example, by the liquid phase epitaxial method, on an n+-type InP substrate 1 with the (100) orientation, under lattice matching being controlled. Then, stripe geometry is made using an insulating layer 6, and p-side and n-side electrodes 7 and 8 are attached to the assembly. In this structure, however, since there is so large a difference in composition between the light emitting layer 3 and the InP upper clad layer 4, the light emitting layer is dissolved during growth of the clad layer 4 to make the growth of the layer 4 itself difficult and to roughen the interface between the both layers; this leads to an increased light loss, resulting in a marked increase in the current necessary for oscillation. Therefore, the structure of this example cannot be applied for a 1.5 μm range laser.

Figure 2:
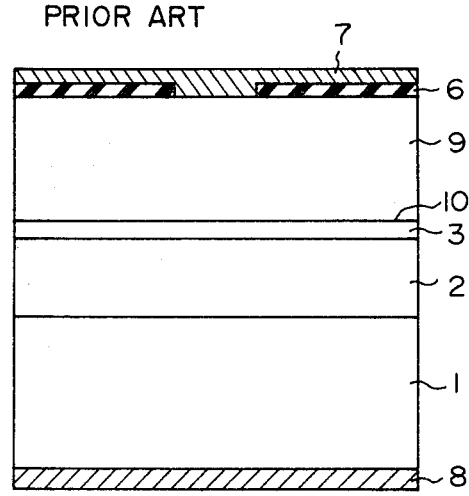
FIG. 2 is a section of a conventional semiconductor laser for a 1.5 to 1.7 μm band, emplying an asymmetrical structure.

A solution for this problem is such a laser as shown in FIG. 2 which employs, in place of the InP upper clad layer 4, an InGaAsP layer having a forbidden band width larger than the light emitting layer 3. That is, the illustrated example is a laser which employs, as the upper clad layer, a p-type InGaAsP layer 9 in place of the p-type InP layer 4. With this structure, the rate of the disolution of the light emitting layer is very small, and a hetero interface 10 can also be held to be relatively flat. However, as compared with InP, InGaAsP is small in the forbidden band width and large in the refractive index, so that the InGaAsP layer 9 does not sufficiently act to confine injected carries and light in the light emitting layer 3; consequently, a large working current is required, which makes it difficult to achieve the CW operation at room temperature.

The present invention is to provide a semiconductor laser in which the clad layer overlying the light emitting layer is made to have a multilayer structure so as to overcome such a defect of the prior art.

With reference to the drawings, the present invention will hereinafter be described in detail.

Figure 3:
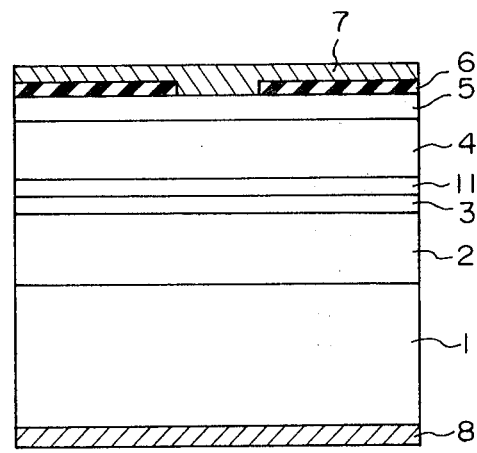
FIG. 3 is a section shown an embodiment of a semiconductor laser of this invention for a 1.5 to 1.7 μm band which has a buffer layer.

FIG. 3 shows an embodiment of this invention as being applied to a laser which oscillates at a range of 1.55 μm. That is, a buffer layer 11 of InGaAsP is grown between the light emitting layer 3 and the InP layer 4. With this arrangement, even when the light emitting layer 3 is made to have a composition for oscillation at the range of 1.55 μm, a hetero, multilayer structure of good quality can be obtained, and since the light emitting layer 3 is sandwiched between the two InP layers 2 and 4, injected carriers and light are effectively confined in the light emitting layer 3 as is the case with the laser for a 1.1 to 1.3 μm band shown in FIG. 1, thus providing for a reduced working current. In a stripe laser having an electrode width of 17 μm, made using the structure of FIG. 3, the CW operation at room temperature was performed. By the way, the oscillation wavelength was 1.565 μm, and the oscillation start current was 300 mA.

Although the present invention has been described in connection with a laser of the 1.5 μm band, the invention is also applicable to lasers of other wavelength ranges. In a case of a 1.6 μm band laser, the rate of the disolution of the light emitting layer increases, but this can be overcome by making the buffer layer itself to be multi-layered.

Figure 4:
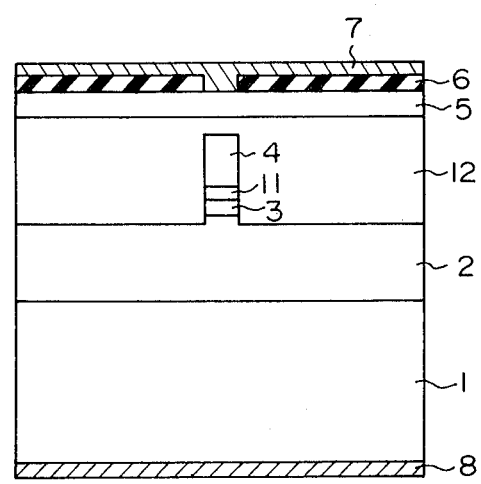
FIG. 4 is a section of another embodiment of the semiconductor laser of this invention which has a buried hetero structure.

The laser structure of this invention can be applied not only to the oxide-insulated stripe type laser of FIG. 3 but also various other stripe type lasers. For example, FIG. 4 shows another embodiment of this invention as being applied to a buried hetero structure laser. This laser can easily be manufactured by using the ordinary liquid phase epitaxial method twice.

As has been described above in detail, this invention employs the above-described structure for the InGaAsP/InP laser for use in the wavelength range of 1.4 to 1.67 μm, thereby to reduce the current necessary for its oscillation, enabling the CW operation at room temperature which has been difficult to achieve in the prior art. The semiconductor laser of this invention has an oscillation wavelength lying in the very low-loss wavelength band of optical fibers, and hence can be used as a light source for high performance optical communications.

What we claim is:

1. In a semiconductor laser formed on an InP substrate having a hetero structure comprising a plurality of $In_{1-x}Ga_xAs_yP_{1-y}$ ($0.42y \leqq x \leqq 0.5y$, $0 \leqq y \leqq 1$) layers which are lattice-matched with InP, said semiconductor laser having carrier injecting electrodes and resonant cavity means formed by a light emitting layer included in said plurality of $In_{1-x}Ga_xAs_yP_{1-y}$ layers, the improvement comprising said layers comprising the light emitting layer having a forbidden band width larger than 0.6 eV but smaller than 0.9 eV at room temperature and sandwiched between two InP layers on the InP substrate, and said layers including a buffer layer having a forbidden band width larger than the forbidden band width of the light emitting layer but smaller than the forbidden band width of InP and disposed between the light emitting layer and the InP layer grown thereon.

2. A semiconductor laser according to claim 1, wherein the forbidden band width of the buffer layer at room temperature is larger than 0.8 eV but smaller than 1.0 eV.

* * * * *